United States Patent [19]

Barbu et al.

[11] Patent Number: 4,749,442

[45] Date of Patent: Jun. 7, 1988

[54] METHOD OF MANUFACTURING CONDUCTIVE ELECTRODES FOR A CIRCUIT ELEMENT, AND SEMICONDUCTOR DEVICE THUS OBTAINED

[75] Inventors: Stefan Barbu; Claude E. P. Chapron, both of Caen, France

[73] Assignee: U.S. Philips Corporation, New York, N.Y.

[21] Appl. No.: 841,128

[22] Filed: Mar. 18, 1986

[30] Foreign Application Priority Data

Mar. 26, 1985 [FR] France ................. 85 04472

[51] Int. Cl.⁴ .............. B44C 1/22; C03C 15/00; C03C 25/06
[52] U.S. Cl. .................... 156/644; 156/657; 156/659.1; 357/67; 357/71; 437/189; 437/201; 437/235
[58] Field of Search ............. 156/657, 659.1, 662, 156/644; 29/571, 580; 357/15, 23.1, 41, 65, 71, 69, 67; 148/1.5, 187; 427/88–90; 437/189, 196, 201, 203, 235

[56] References Cited

U.S. PATENT DOCUMENTS

| | | | |
|---|---|---|---|
| 3,421,985 | 1/1969 | Baker et al. | 156/656 X |
| 4,164,461 | 8/1979 | Schilling | 204/192 EC |
| 4,436,582 | 3/1984 | Saxena | 156/656 |

*Primary Examiner*—William A. Powell
*Attorney, Agent, or Firm*—Paul R. Miller

[57] ABSTRACT

In the method according to the invention conductive electrodes are provided with the aid of a mask aligned with respect to at least two contact windows present in an insulating layer. First, layers of metal combining with semiconductor material, for example, Pt silicide, are provided in the contact windows. A narrow region of the insulating layer between the two contact windows may have a reduced dimension because in their extreme relative positions the conductive electrodes can only partially cover the contact windows. The invention also relates to semiconductor devices comprising logic (or low-noise) transistors, or transistors for very high frequencies whose structure is improved with respect to their dimensions, their series resistance value and/or their gain.

8 Claims, 3 Drawing Sheets

METHOD OF MANUFACTURING CONDUCTIVE ELECTRODES FOR A CIRCUIT ELEMENT, AND SEMICONDUCTOR DEVICE THUS OBTAINED

The invention relates to a method of manufacturing conductive electrodes for a circuit element in which conductive electrodes are provided in accordance with a desired pattern by using a mask positioned with respect to at least two adjacent contact windows in an insulating layer which is present on a semiconductor body with the adjacent contact windows being located on two adjacent semiconductor surface regions of the circuit element and being laterally separated by at least one narrow region of the insulating layer.

In prior art methods the conductive electrodes are directly deposited on the bare surface of the semiconductor body by covering the insulating layer over the edges of the contact windows in such a way as to allow for a tolerance A of positioning the mask used for the conductive electrodes with respect to the contact windows. The contact windows are always entirely filled by the corresponding conductive electrodes since the conductive electrodes entirely overlap the edges of the underlying contact windows.

The methods described above have the drawback that narrow regions should have a width $E_o$ which is at least equal to $B+2A$, where B is the minimum distance between two conductive electrodes.

The invention has for its object to provide a method in which this width E of the narrow region is less than $B+2A$.

The invention is based on the recognition that prior to the conductive electrodes a metal which chemically combines with the material of the semiconductor surface is provided and that of the two adjacent conductive electrodes at least one only partially covers the corresponding window.

To this end, the method according to the invention is characterized in that it comprises the following steps:

(a) opening contact windows in an insulating layer in such a manner that narrow region has a nominal width E which is between C and $B+2A$, and which is sufficient to prevent a short-circuit between the two adjacent surface regions caused by bridging the narrow region in extreme positions of the conductive electrodes defined by the tolerance A while allowing for the relative position of the conductive electrodes and the narrow region and it is tolerated that of the two adjacent conductive electrodes at least one is susceptible to only partially covering the corresponding contact window, where A=the tolerance of positioning the conductive electrodes with respect to the contact windows on either side of their nominal position, B=the minimum distance between two conductive electrodes, C=the minimum width of the narrow region of the insulating layer realizable by photo-etching techniques, (b) providing a metal chemically combining with the surface material of the semiconductor body in the contact windows such that the bare surface of the semiconductor body in the contact windows are covered with a combined metal layer.

(c) Providing the conductive electrodes in accordance with the desired pattern with the aid of the mask.

The metal which chemically combines with the surface material of the semiconductor body may be, for example, Pt or Pt-Ni.

Between steps (a) and (b) the method may comprise a step of providing at least one of the semiconductor surface regions for a circuit element. Preferably the circuit element is a transistor.

Preferably, the method according to the invention is further characterized in that the conductive electrodes have a width which is at least equal to that of the corresponding contact windows and that under nominal conditions the mask is arranged in such a manner that at least a boundary of each conductive electrode susceptible of oinly partially covering the corresponding window coincides with the edge of the corresponding contact window contiguous to the narrow region of the insulating layer, and that the nominal value E of the narrow region is at least equal to the higher of two values defined by $$A(3-p) \text{ and } B+(2-p)A,$$

where p=integer equal to 1 or 2 depending on whether it is tolerated that of two adjacent conductive electrodes, one or both may only partially cover the corresponding contact windows.

In a further embodiment of the method according to the invention, the circuit element is a transistor for high frequencies or low noise in which, for preserving a minimum emitter contact resistance, a partial covering is only tolerated for two conductive base electrodes situated on either side of an emitter (p=1) with the emitter contact window adjoining two narrow regions that laterally borders the emitter contact window and in which in the nominal position the conductive emitter electrode overlaps these narrow regions on either side by a quantity A and the conductive base electrodes entirely fill the base contact windows in the nominal position. In this manner a transistor is obtained which has reduced dimensions that are much smaller than in the prior art.

In another embodiment of the method according to the invention the integer p is chosen to be 2 and the insulating layer comprises both a base contact window and an emitter contact window of a transistor, and for obtaining a minimum base resistance, the minimum width of the portions of conductive electrodes, which portions in each of the contact windows are located on the semiconductor surface regions, is equal to a given value G; and the width of the contact windows and of the conductive emitter and base electrodes is equal $A+G$. This arrangement is particularly interesting for the emitter electrodes. Therefore a value $G_1$ can be taken for the emitter and a value $G_2$ for the base.

In a modification particularly envisaging minimum lateral dimensions, each conductive electrode which is susceptible of only partially covering the corresponding contact window has a width less than that of the corresponding contact window.

According to an advantageous form of the method according to the invention the nominal value E of the narrow region is at least equal to $2A-(p-1)B$, where p=an integer equal to 1 or 2, depending on whether it is tolerated that of two adjacent conductive electrodes one of them, or both, may only partially cover the corresponding contact windows. If this value E is less than C (where C=minimum width of the narrow region as determined by the photo-etching technique used to provide the contact windows), the value C is chosen.

The transistor may advantageously be of the multicollector type as is often used in integrated circuits of the injection logic (I²L) type and in which type p=2 where the contact windows may be collector contact windows and/or contact windows for the transistor base region or the injector.

The invention also relates to a semiconductor device comprising at least one transistor for operation at very high frequencies integrated in a semiconductor body and comprising an insulating layer provided on a surface of the semiconductor body which insulating layer has at least two adjacent contact windows, one for the emitter region and the other for the base region, with the contact windows being laterally separated by a narrow region of the insulating layer, and having conductive emitter and base electrodes disposed in the contact windows, and which is characterized in that the surfaces in the contact windows are entirely covered with layers of metal combined with the material of the semiconductor body, in that the conductive emitter electrode entirely covers the emitter contact window and therefore has a width exceeding the width of the emitter contact window by a quantity 2A, in that the distance between the conductive emitter and base electrodes is equal to a quantity B and in that the width E of the narrow region of the insulating layer is at least equal to one of the two values 2A and A+B, and is less than 2A+B.

Furthermore, the inventio relates to a semicondutor device comprising at least one transistor integrated in a semiconductor body and comprising an insulating layer provided on a surface of the semiconductor body, which insulating layer has two adjacent contact windows, one for the emitter region and the other for the base region, with the contact windows being laterally separated by a narrow region of the insulating layer, and having conductive emitter and base electrodes disposed in the contact contact windows, and which is characterized in that the surfaces in the windows are entirely covered with layers of metal combined with the material of the semiconductor body and in that the narrow region has a width E which is equal to the distance B between the conductive emitter and base electrodes.

Finally the invention relates to a semiconductor device comprising at least one multicollector I²L transistor structure integrated in a semiconductor body and comprising an insulating layer provided on a surface of the semiconductor body and which has at least two collector contact windows which are laterally separated by a narrow region of the insulating layer and conductive collector electrodes disposed in the contact windows, and which is characterized in that the surfaces in the contact windows are entirely covered with a layer of metal combined with the material of the semiconductor body and in that the distance B between the conductive collector electrodes is greater than the width E of the narrow region.

The invention will now be described by way of example with reference to the drawing.

Figure 1:
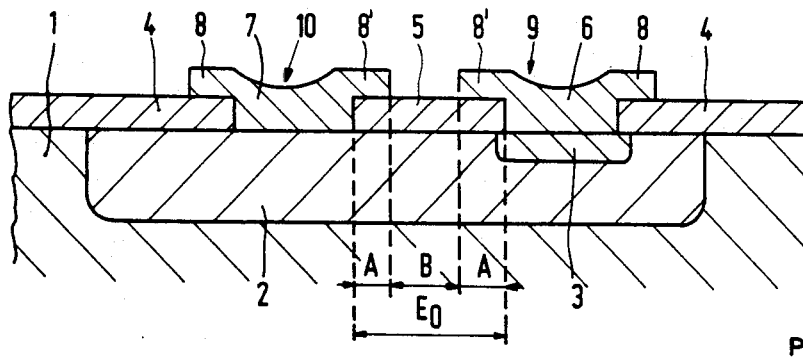
FIG. 1 shows a prior art transistor in which the conductive electrodes are shown in their nominal position.

In FIG. 1 a prior art transistor is formed on a semiconductor body or substrate 1 of a first conductivity type and comprises a diffused or implanted base region 2 of a second conductivity type opposite to the first conductivity type and a diffused or implanted emitter region 3 in a part of the base region 2 and having conductive emitter electrode 6 and base electrode 7 arranged in the contact windows 9 and 10, respectively, of an insulating layer 4 with the contact window 9 serving also for realization of the emitter region. In their nominal position the conductive electrodes 6 and 7 laterally overlap at 8 on either side on the insulating layer 4 by a distance or quantity A. This quantity A is at least equal to the positioning tolerance of the conductive electrodes 6 and 7 on either side of their nominal position and which causes the contact windows 9 and 10 to be entirely covered with the conductive electrodes 6 and 7, respectively. If the reference B indicates the minimum distance between two conductive electrodes, the narrow region 5 of the insulating layer 4 separating the contact windows 9 and 10 thus has a width $E_o$ which is at least equal to B+2A.

For example, for A=1.75 microns and B=2.5 microns, $E_o \geq 6$ microns.

In FIGS. 2a to 2d the impurities for the emitter region 3 are provided through a window 11 which is separated from a base contact window 12 by a narrow region 25 having a width E of less than B+2A.

Figure 2A:
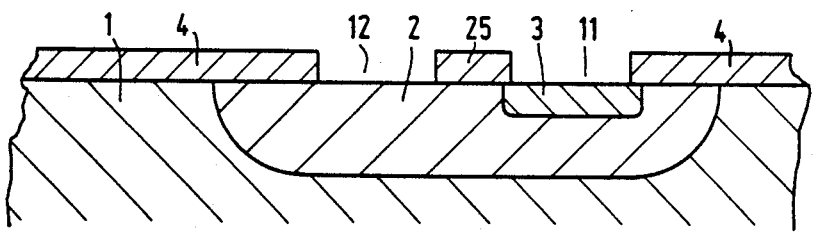
FIGS. 2a to 2d illustrate the steps of the method according to the invention.

FIG. 2a shows the arrangement in the last stage which also occurs in the prior art methods, except for the width of the narrow region 25, that is to say, after providing the emitter region 3 through the window 11.

Figure 2B:
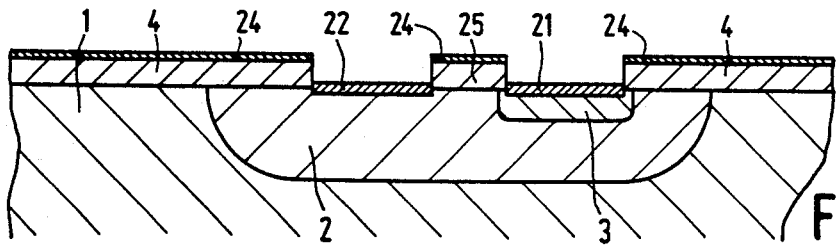
Figure 2C:
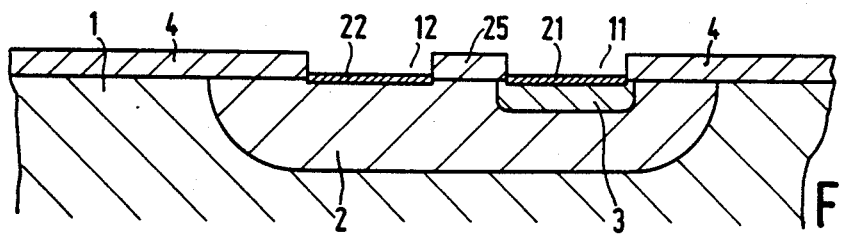
Figure 2D:
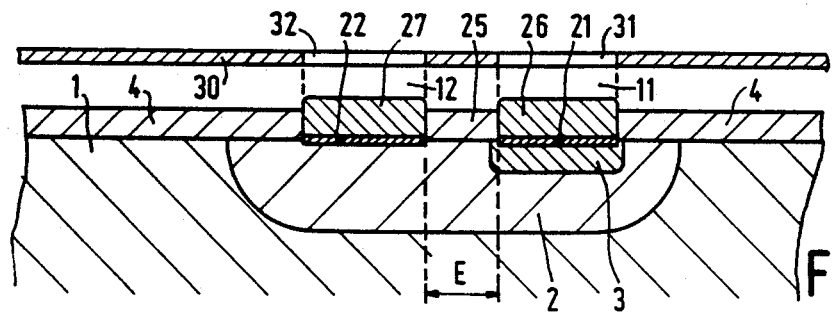

In FIG. 2b approximately 500 Å of Pt or of Pt-Ni is provided on the insulating layer 4 and on the bare surface of the semiconductor body in the contact windows 11 and 12 in a manner of providing an alloy for forming a silicide layer of Pt denoted by the reference numeral 21 for the emitter region 3 and 22 for the base region 2, whereas the insulating layer 4 is covered with a non-combined metal layer 24 of Pt or Pt-Ni as the case may be. This step is known in itself and is usually utilized for realizing Schottky contacts. It is to be noted that the Schottky effect is avoided in known manner when the surface of the semiconductor body is highly doped (for example $10^{20}/cm^2$) irrespective of whether the semiconductor zone itself is highly doped (for example, the emitter zone) or whether a highly doped superfical layer is realized.

The subsequent step (FIG. 2c) consists of selectively removing the layer 24 with the aid of a solution commonly used in semiconductor technology.

The final step (FIG. 2d) consists of realizing in known manner conductive emitter 26 and base electrodes 27 having a thickness of approximately 1 micron. These conductive electrodes 26 and 27 have the same width in the example chosen as the contact windows 11 and 12, respectively, and in their nominal position they entirely fill these windows as shown.

Figure 3A:
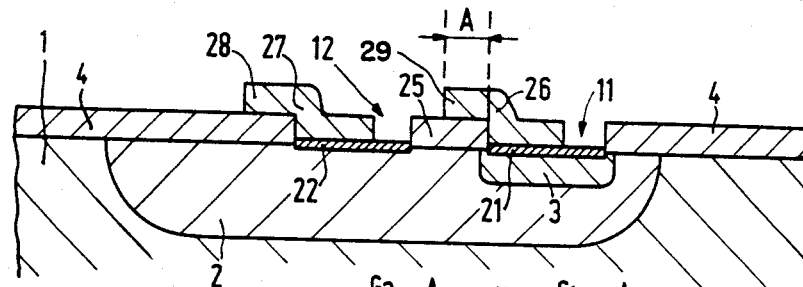
FIGS. 3a and 3b show the extreme positions that can be occupied by the conductive electrodes of the transistor of FIG. 2d within the tolerance limits A on either side of the nominal position.
Figure 3B:
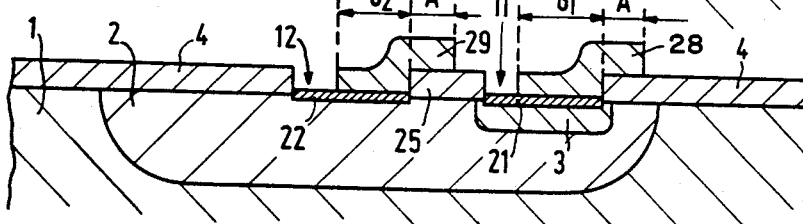

FIGS. 3a and 3b illustrate the extreme cases of positioning the conductive electrodes 26 and 27 with respect to the contact windows 11 and 12 with possibilities of covering the insulating layer 4 (part 28) and the narrow region 25 (part 29) over a distance A. It can be seen that if the width E of the narrow region 25 is more than or equal to A, there can be no short-circuit between the emitter region 3 and the base region 2 by bridging of the narrow region 26 by one or the other conductive electrode 26 or 27.

If on the other hand in the manufacturing process one has B>A, which is generally the case, then one chooses E=B.

Summarizing, in case it is tolerated that the two adjacent conductive electrodes may only partially cover the corresponding contact windows, E may be chosen to be at least equal to the higher of two values A and B, which is generally higher than the value C(C=minimum width of the narrow region as determined by the photo-etching technique used to provide the contact windows 11 and 12).

For example, for A=1.75 microns, B=2.5 microns and C=2 microns we have E=2.5 microns instead of $E_o$=6 microns.

This reduction in the width E of the narrow region 25 with respect to the value $E_o$ of the prior art permits of reducing the intrinsic resistance $R_b$ of the base region. On the other hand, if this advantage is to be preserved entirely for the conductive electrodes 26 and 27, they should have a minimum covering distance G, denoted by $G_1$ and $G_2$ for the corresponding windows 11 and 12, respectively, in such a manner that the contact resistance is much lower than $R_b$. The width of the windows 11 and 12 then is $G_1$+A and $G_2$+A, respectively, whereas in the prior art the respective values of $G_1$ and $G_2$ might, for example, be satisfactory. In other words the optimization of the value of the base resistance $R_b$ does not necessarily provide a gain in the dimensions of the transistor: the two advantages are not entirely cumulative.

Figure 4:
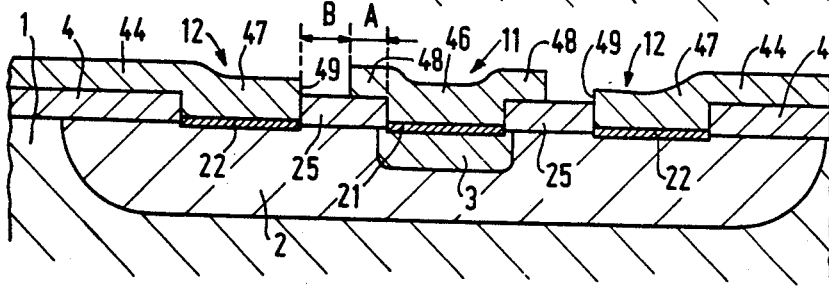
FIGS. 4, 5a and 5b show a hyperfrequency transistor in accordance with the invention, with its conductive electrodes being in the nominal position, to the extreme left and to the extreme right, respectively.
Figure 5A:
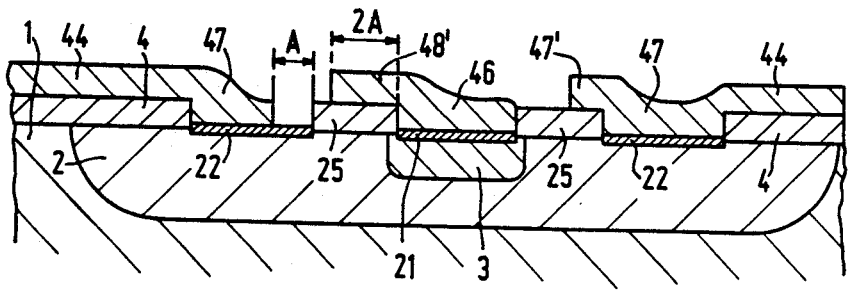
Figure 5B:
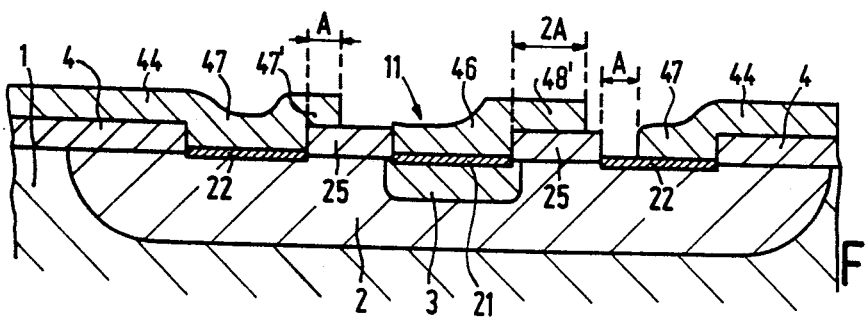

FIGS. 4, 5a and 5b show transistors for high frequencies, notably for hyperfrequencies, which have emitter contacts of excellent quality (combined metal layer 21 and conductive electrode 46), whereas one is less demanding for the base contacts (combined metal layer 22 and conductive electrode 47). This means that under all circumstances the conductive electrode 46 should completely cover the contact window 11 through which window 11 the impurities for the emitter region 3 have been provided, whereas only a partial covering of the base contact windows 12 by the conductive electrodes 47 is tolerated.

In FIG. 4 the conductive electrodes 46 and 47 have their nominal position. The conductive emitter electrode 46 overlaps at 48 by a quantity of A on either side of two narrow regions 25 separating the contact window 11 from the two contact windows 12 each having a conductive base electrode 47. On one side these two conductive base electrodes 47 have an edge 49 contiguous to one of the narrow regions 25. On their opposite sides the conductive base electrodes 47 extend at 44 on the insulating layer 4.

FIGS. 5a and 5b illustrate the extreme positions of the conductive electrodes 46 and 47 with respect to the contact windows 11 and 12 and show that the maximum overlap 48' of the conductive electrode 46 on one or the other narrow region 25 is equal to 2A. Taking into account that the conductive electrodes 46 and 47 are mutually spaced by at least a distance B (see FIG. 4), it can be derived that the width E of the narrow region 25 in this case is at least equal to the higher of two values A+B and 2A. For B>A, which is generally the case, we would thus have E=A+B.

For example, for A=1.75 microns and B=2.5 microns, E could be 4.25 microns.

Figure 6:
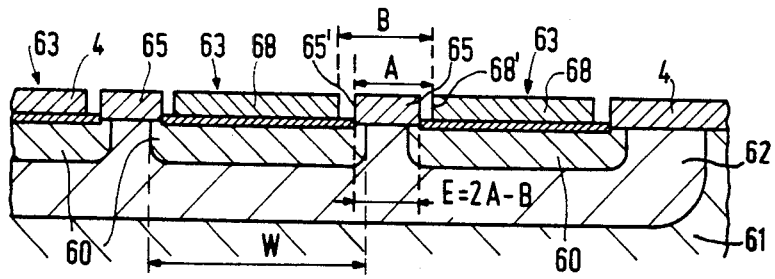
FIGS. 6, 7a and 7b show in partial cross-section show a multicollector I²L transistor structure realized in accordance with the invention, with its conductive electrodes being in the nominal position, to the extreme left and to the extreme right, respectively.
Figure 7A:
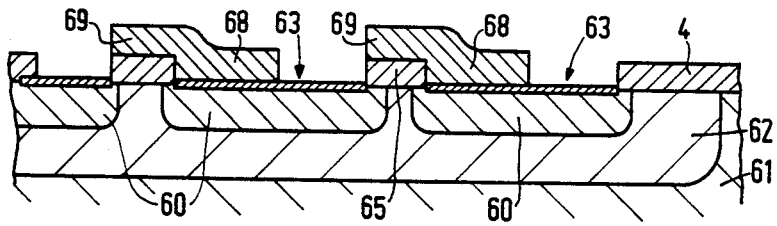
Figure 7B:
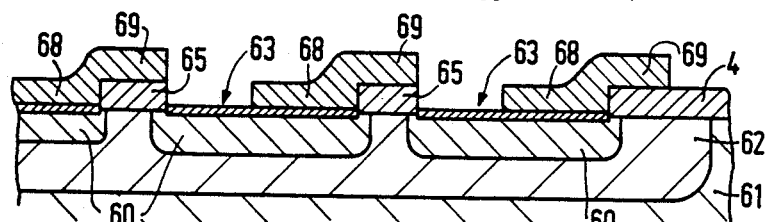

FIGS. 6, 7a and 7b show logic transistor structures of the I²L type for a process in which A<B<2A. Such a transistor has an emitter region 61, for example formed by the semiconductor substrate, an impurity doped zone forming a base region 62 and collectors 60 of a given width W which may be diffused or implanted through the windows 63 in the insulating layer 4. The windows 63 are separated by narrow regions 65 of the insulating layer 4.

To improve the transistor gain, the ratio between the width of the collector and that of the narrow insulating region may be increased, and in the case when the value of the collector contact resistance need not be optimal it is possible to give the conductive electrodes 68 a width less than that of the windows 63, thus accepting that the windows 63 are covered only partially by the conductive electrodes 68. As is shown in FIGS. 7a and 7b, which illustrate the relative extreme positions of the conductive electrodes 68 and windows 63, the edge or edges 68' (FIG. 6) of the conductive electrodes 68 adjacent to a narrow region 65 may be spaced over at least the distance A from the edge 65' (FIG. 6) which is opposite thereto. This condition ensures that the overlapping portions 69 of the conductive electrodes 68 on the narrow regions 65 do not cause a shortcircuit between two adjacent collectors by bridging the narrow regions 65.

For the conductive electrodes 68 spaced by a distance B, there applies that E≦2A−B (and, of course, not smaller than C). For a given width W of the collectors 60 a considerable reduction in the dimensions of the transistor is obtained, which is accompanied by a notable increase in its gain.

For example, for A=1.75 microns and B=2.5 microns, one would have E≦1 micron, hence a value which is much less than $E_o$=6 microns. It is possible to choose a minimum value for E, which is equal to the value C as determined by photo-etching methods. For example, E=C=2 microns.

Figure 8:
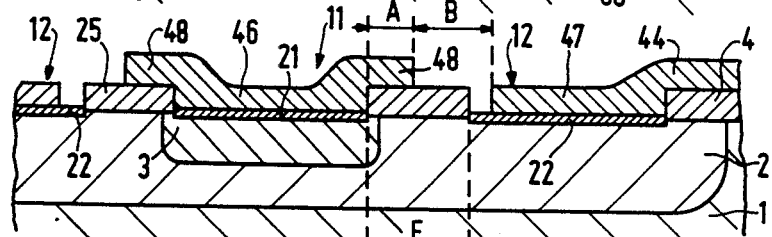
FIGS. 8, 9a and 9b show a hyperfrequency transistor in accordance with the invention, with its conductive electrodes being in the nominal position, to the extreme left and to the extreme right, respectively.
Figure 9A:
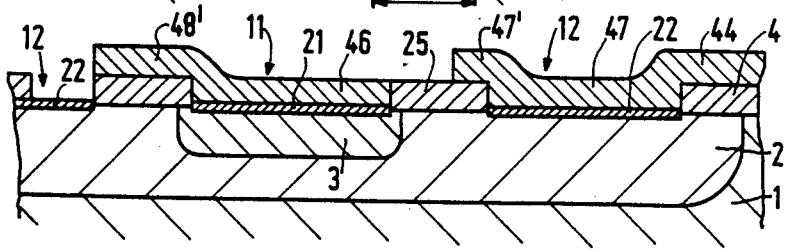
Figure 9B:
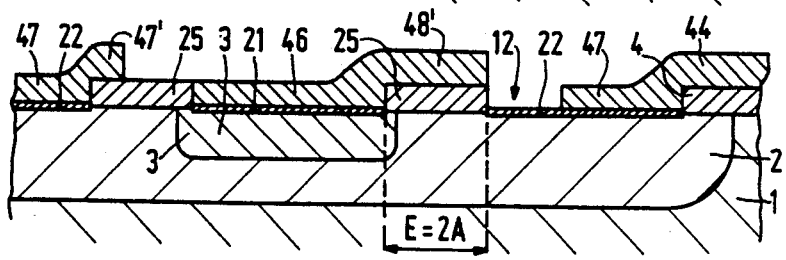

FIGS. 8, 9a and 9b correspond to FIGS. 5, 5a and 5b that in their nominal position except the conductive base electrodes 47 are spaced from the narrow region 25. As is shown in FIGS. 9a and 9b, which illustrate the extreme relative positions of the metal conductive electrodes 46 and 47 with respect to the contact windows 11 and 12, respectively, E may be given a value which is at least equal to 2A when A<B.

For example, for A=1.75 microns and B=2.5 microns, we have E=3.5 microns instead of A+B=4.25 microns in the case of FIG. 4 and $E_o$=6 microns in the prior art.

The invention is not limited to the embodiments that have been described and illustrated. The invention is, for example, equally applicable to lateral transistors of the PNP type. As far as the I²L transistors are concerned, it is also applicable to the conductive electrodes of the base region and the injector region.

What is claimed is:

1. A method of manufacturing conductive electrodes for a circuit element comprising the steps of
   forming an insulating layer on a semiconductor body;
   opening at least two adjacent contact windows in said insulating layer, said adjacent contact windows being laterally separated by at least one narrow region of said insulating layer, said narrow region having a dimension E, said dimension E being sufficient to prevent a short-circuit between said adjacent contact windows,
   wherein said dimension E lies between the values C and B+2 A, where A is the tolerance distance of positioning conductive electrodes with respect to said contact windows at either side of a normal position of said conductive electrodes, B is a minimum distance between two said conductive electrodes, and C is a minimum dimension of said narrow region;
   providing a metal into said contact windows, said metal chemically combining with material of a surface layer of said semiconductor body such that a combined metal layer is formed in said contact windows; and
   providing said conductive electrodes relative to said contact windows in contact with said combined metal layer, said step of providing said electrodes being carried out with a mask.

2. A method according to claim 1, wherein said conductive electrodes have a dimension at least equal to a dimension of a corresponding one of said contact windows, wherein said mask is arranged having one boundary of a corresponding conductive electrode coinciding with an edge of said correspondinig contact window contiguous to said narrow region, and wherein said dimension E is at least equal to the larger of values A(3−p) and A(2−p)+B, where p is an integer equal to 1 or 2 depending on whether only one or both of said adjacent conductive electrodes partially cover said corresponding contact window.

3. A method according to claim 2, wherein said circuit element is a transistor for very high frequencies, and wherein two of said conductive electrodes are base electrodes having a partial covering of said corresponding contact windows, said two base electrodes being situated at opposite sides of a third conductive electrode, said third conductive electrode being an emitter where p equals 1, and a contact window for said emitter adjoining two of said narrow regions at opposite sides of said emitter contact window, said emitter electrode overlapping said two narrow regions on either side by said distance A, said two base electrodes entirely filling respective base contact windows.

4. A method according to claim 2, wherein p equals 2, wherein said contact windows include a base contact window and an emitter contact window for a transistor, wherein said conductive electrodes have a minimum distance equal to a distance G for obtaining a minimum base resistance $R_b$, said conductive electrodes contacting a portion of said combined metal layer in said contact windows, and wherein said conductive windows and conductive emitter electrode and conductive base electrode respectively extend a distance of A+G.

5. A method according to claim 1, wherein each conductive electrode has a dimension less than the distance of a corresponding contact window, said each conductive electrode only partially covering the corresponding contact window.

6. A method according to claim 5, wherein said distance A is less than said distance B, and said distance B is less than 2A, and wherein said dimension E is at least equal to 2A−(p−1)B, where p is an integer equal to 1 to 2 depending on whether one or both of said adjacent conductive electrodes only partially cover corresponding contact windows.

7. A method according to claim 5 or claim 6, wherein said circuit element is a multicollector $I^2L$ transistor with p equal to 2, and wherein said contact windows are collector windows.

8. A method according to claim 1, wherein said metal is one of Pt and Pt-Ni.